United States Patent
Rehm et al.

(10) Patent No.: US 7,843,671 B2
(45) Date of Patent: Nov. 30, 2010

(54) ELECTRIC MACHINE CONTROL SYSTEM

(75) Inventors: Lothar Rehm, Herrenberg (DE); Thomas Von Raumer, Stuttgart (DE)

(73) Assignee: Daimler AG, Stuttgart (DE)

( * ) Notice: Subject to any disclaimer, the term of this patent is extended or adjusted under 35 U.S.C. 154(b) by 304 days.

(21) Appl. No.: 12/089,479

(22) PCT Filed: Sep. 29, 2006

(86) PCT No.: PCT/EP2006/009465
§ 371 (c)(1),
(2), (4) Date: Jul. 25, 2008

(87) PCT Pub. No.: WO2007/042159
PCT Pub. Date: Apr. 19, 2007

(65) Prior Publication Data
US 2008/0278869 A1 Nov. 13, 2008

(30) Foreign Application Priority Data
Oct. 8, 2005 (DE) .................. 10 2005 048 330

(51) Int. Cl.
*H02H 7/08* (2006.01)
(52) U.S. Cl. .................... 361/31; 361/23; 318/801; 318/811; 318/400.01; 318/400.02; 318/700; 388/800; 388/809; 388/816; 388/821; 388/812; 388/813; 388/814
(58) Field of Classification Search .......... 388/800, 388/809, 816, 821, 812, 813, 814; 318/801, 318/811, 400.01, 400.02, 700, 565, 563; 361/31, 23
See application file for complete search history.

(56) References Cited

U.S. PATENT DOCUMENTS

| | | | |
|---|---|---|---|
| 4,451,771 A * | 5/1984 | Nagase et al. | 318/800 |
| 4,751,447 A * | 6/1988 | Okachi | 318/772 |
| 4,864,202 A | 9/1989 | Nitschke et al. | |
| 5,912,539 A * | 6/1999 | Sugitani et al. | 318/434 |
| 5,927,430 A * | 7/1999 | Mukai et al. | 180/446 |
| 6,026,926 A * | 2/2000 | Noro et al. | 180/446 |
| 6,141,196 A * | 10/2000 | Premerlani et al. | 361/78 |

(Continued)

FOREIGN PATENT DOCUMENTS

DE   36 39 065 C2   5/1988

(Continued)

OTHER PUBLICATIONS

International Search Report dated Mar. 13, 2007 with English translation of relevant portions (Four (4) pages).

(Continued)

*Primary Examiner*—Rita Leykin
(74) *Attorney, Agent, or Firm*—Crowell & Moring LLP

(57) ABSTRACT

A drive system for an electrical machine is provided. The system includes a control unit and a monitoring unit, which is independent of the control unit. The control unit includes a device that converts one or more incoming operating parameters of the electrical machine to an output value. The monitoring unit includes a device that converts the operating parameters to a comparison value, with the conversion being carried out more quickly in the control unit than in the monitoring unit. A comparator compares the output value or an intermediate value of the output value with the comparison value of the output value or of the intermediate value.

12 Claims, 3 Drawing Sheets

U.S. PATENT DOCUMENTS

Figure 1:
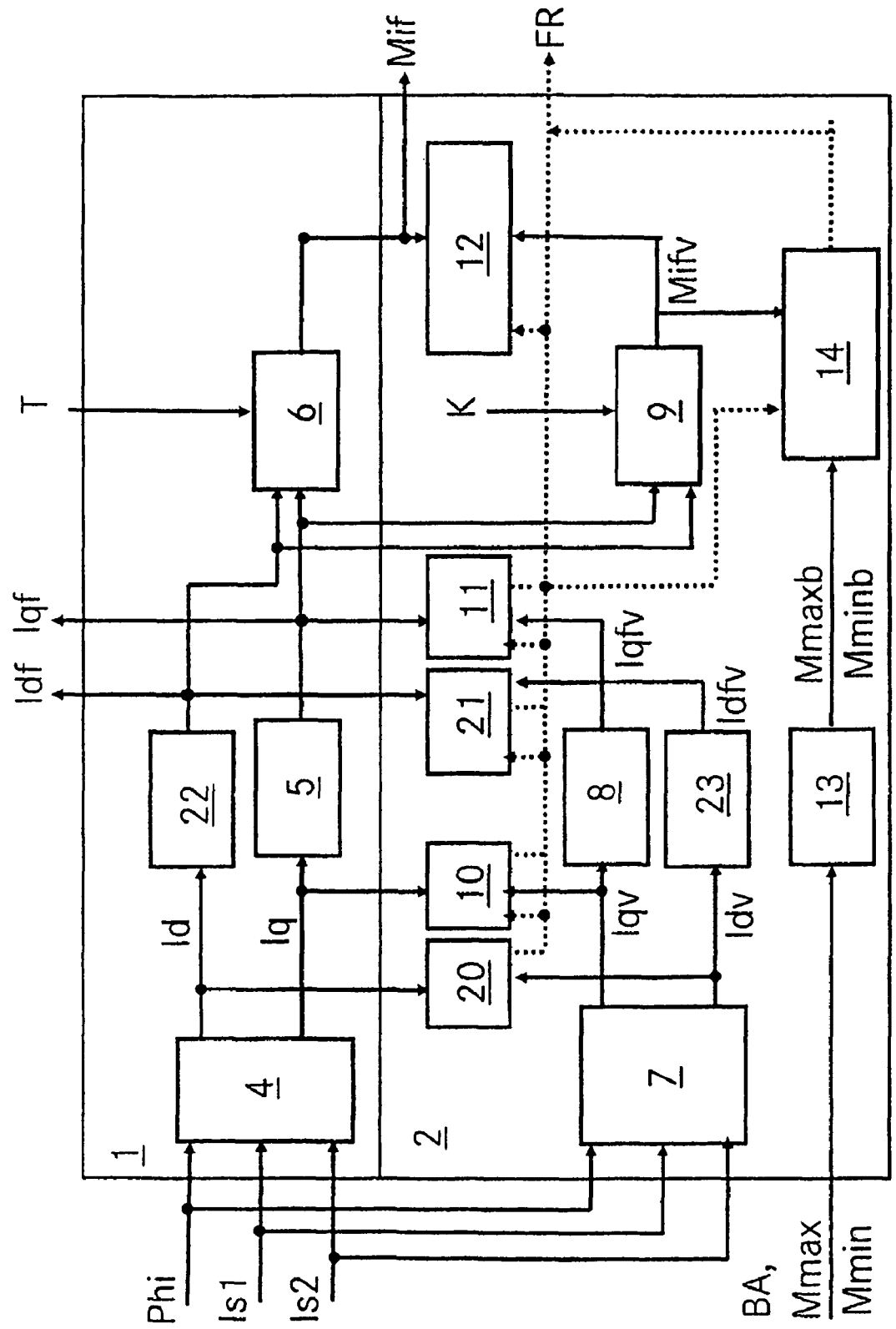

| | | | |
|---|---|---|---|
| 6,415,004 B1 * | 7/2002 | Fujimura et al. | 375/324 |
| 6,992,448 B2 * | 1/2006 | Fujimoto et al. | 318/400.02 |
| 2003/0179004 A1 | 9/2003 | Fukusumi et al. | |
| 2003/0193310 A1 | 10/2003 | Raftari et al. | |
| 2005/0162113 A1 * | 7/2005 | Fujimoto et al. | 318/434 |

FOREIGN PATENT DOCUMENTS

| | | | |
|---|---|---|---|
| DE | 103 10 131 A1 | 12/2003 | |
| DE | 102 51 095 A1 | 5/2004 | |
| DE | 10 2004 002 767 A1 | 8/2005 | |
| DE | 10 2005 025 994 A1 | 1/2007 | |
| DE | 102 51 905 B4 | 2/2007 | |

OTHER PUBLICATIONS

German Search Report dated Jul. 25, 2008 With English translation of Relevant portion (Nine (9) pages).

International Search Report dated Mar. 13, 2007 with English translation of relevant portions (Four (4) pages).

PCT Form/ISA/237 Written Opinion of the International Searching Authority with English translation (Eleven (11) pages).

* cited by examiner

ELECTRIC MACHINE CONTROL SYSTEM

BACKGROUND AND SUMMARY OF THE INVENTION

Exemplary embodiments of the present invention relates to a drive system for an electrical machine, having a control unit and a monitoring unit, which is independent of the control unit, and to a method for operation of an electrical machine.

German patent document DE 102 51 095 A1 discloses a method for operation of an electrical machine, having a drive system, in which an operating variable of the electrical machine and/or of the drive system is monitored. The permissibility of an actual torque of the electrical machine is checked, and a fault reaction is initiated if the actual torque is not permissible. The permissibility of the actual torque is preferably checked in such a way that a permissible torque is formed from a nominal torque and from predefined limit values for the nominal torque, with the actual torque being permissible if its discrepancy from the permissible torque does not exceed a specific magnitude. This method can be used to monitor an electrical machine which is used as a starter/generator or as a hybrid drive in a motor vehicle.

Exemplary embodiments of the present invention provide a drive system with a fast reaction rate and good data quality, as well as a method for its operation.

A drive system for an electrical machine, comprising: a control unit including a device that converts one or more incoming operating parameters of the electrical machine to an output value; a monitoring unit, which is independent of the control unit, wherein the monitoring unit includes a device that converts the operating parameters to a comparison value, and the conversion is carried out more quickly in the control unit than in the monitoring unit; and a comparator, which compares the output value or an intermediate value of the output value with the comparison value.

Exemplary embodiments of the present invention provide a control unit for the drive system has a device that converts one or more incoming operating parameters of the electrical machine to an output value. A monitoring unit has a device that converts these operating parameters to a comparison value. Accordingly, the conversion is carried out more quickly in the control unit than in the monitoring unit. Furthermore, a comparator is provided, which compares the output value or an intermediate value of the output value with the comparison value of the output value or of the intermediate value.

The control unit forms the output value quickly and independently of the monitoring unit. This leads to the drive system having a fast reaction rate. The rapid production of the output value by the control unit makes it possible to use the output value as a controlled variable for a fast-reaction control loop.

Faults in the formation of the output value can be identified by comparison of the output value with the comparison value which is formed in the monitoring unit. The quality of the output values is monitored. The check of the intermediate values allows the fault location to be located. In this case, the device which has received error-free data and has emitted erroneous data is understood to be the fault location.

The advantage of this solution according to the invention is that the control unit can operate quickly and the fault monitoring can operate slowly, without significantly restricting the fault monitoring in this way. In particular, this also allows inaccuracies in the output value caused by the rapid processing to be discovered. Because, of course, these inaccuracies do not occur in this form in the comparison value, which is formed slowly, they lead to a discrepancy between the output value and the comparison value. If this discrepancy between the output value and the comparison value exceeds a specific tolerance band, then a fault is identified. It is therefore possible to check that the output value is correct.

In one aspect, the monitoring unit has a comparator, which compares a value formed from a value of the control unit in a device with a comparison value formed in a device of the monitoring unit. This makes it possible to identify faults in the formation of values by the control unit.

For example, an actual torque which is calculated from current components and from the information from a temperature sensor can be compared with an actual torque calculated from the same current components and from theoretical temperature values stored in a computer. This allows errors in the torque calculation to be identified. For example, it is possible to identify when the result of the torque calculation in the control unit is always incorrectly a zero torque. It is likewise possible to identify when the detected temperature values differ to a major extent from the theoretically expected values.

For example, an actual torque which is calculated from current components and from theoretical influencing variables stored in a computer can be compared with permissible limit values of the actual torque. This allows identification of errors in the torque calculation. It is then possible to identify when the result of the torque calculation is outside the permissible limit values.

In one aspect, the comparator identifies a fault when the output value which is supplied to it, the intermediate value of the output value or the value formed in a device is outside a tolerance band of the comparison value supplied to it. This makes it possible to permit minor discrepancies which are caused by the different calculation of the comparison values. Major differences which can be caused only by errors in the process of determining the values are in contrast identified as faults.

In one aspect, in the event of a fault, the comparator acts on an output stage of the electrical machine. For example, the output stage can be switched off or shorted. This prevents incorrectly calculated output values of the control unit from incorrectly driving the output stage. This prevents possible damage to the electrical machine. Impermissible torque formation is likewise prevented.

In one aspect, in the event of a fault, the comparator blocks the fault reaction of another comparator. This prevents a fault in one comparator leading to fault reactions in subsequent comparators, due to consequential errors. Since the fault reactions of other comparators are blocked, this ensures that the only comparator which produces a fault reaction is that in which a fault was initially identified. It is therefore possible to determine the source of a fault. This is important information for determination of the cause of the fault.

In one aspect, the output value is an actual current component for closed-loop control of an electrical machine. A control loop can therefore be described for control of the electrical machine. In this case, current components of the electrical machine are detected, converted and checked for errors in comparators. The actual current component calculated in this way is then provided as an output value from a closed-loop control system. A quickly calculated actual current component can therefore be made available to the closed-loop control system, which nevertheless is highly reliable, because it has been checked in a comparator.

In one aspect, the output value is a nominal current component for closed-loop control of an electrical machine. This allows a nominal current component to be made available for closed-loop control, which is calculated and output quickly and is nevertheless highly reliable because it has been checked in a comparator.

The method for operation of an electrical machine having a drive system detects operating parameters of the electrical machine in the control unit and in the monitoring unit. The detected operating parameters are converted to an output value in the control unit. According to the invention, the detected operating parameters are converted to a comparison value in the monitoring unit. In this case, the conversion in the control unit is carried out more quickly than in the monitoring unit. The output value or an intermediate value of the output value is compared with the comparison value.

This makes it possible to identify errors in the formation of the intermediate values and in the formation of the output value. If a plurality of comparators are provided, then the fault location where the fault initially occurred can be determined. For example, it is possible to determine the device in which the fault initially occurred. It is likewise possible to determine the nature of the fault.

In one aspect of the method, a fault is identified when the output value or the intermediate value of the output value is outside a tolerance band of the comparison value. This tolerance band prevents minor discrepancies in the values to be compared being interpreted as faults, and initiating a fault reaction. The reason for such minor discrepancies may lay in the different computation rate and computation accuracy of the devices in the control unit and monitoring unit, and may therefore be unavoidable. The tolerance band ensures that only sufficiently large discrepancies from the comparison value are identified as faults. This improves the fault identification quality.

In one aspect of the method, in the event of a fault, an output stage of the electrical machine is switched off or shorted. This results in a safety shutdown of the electrical machine, thus ensuring that the electrical machine does not receive any incorrect or impermissible control commands in the event of a fault. The electrical machine is protected against damage, and impermissible torque formation is likewise prevented.

In one aspect of the method, in the event of a fault, an actual torque of the electrical machine is set to an implausible value. This implausible value is preferably a value which is not critical for the electrical machine. For example, the torque is set to an extreme value which is defined as being impermissible and must not be used during normal operation. This can then lead to a fault being identified when the actual torque is compared with the corresponding permissible limit values of the actual torque, or to a safety shutdown of the electrical machine.

In one aspect of the method, in the event of a fault, the fault reaction of another comparator is blocked. It is therefore possible to associate the fault with a comparator which has initiated the fault reaction. This makes it easier to identify the cause of the fault.

BRIEF DESCRIPTION OF THE DRAWING FIGURES

Figure 2:
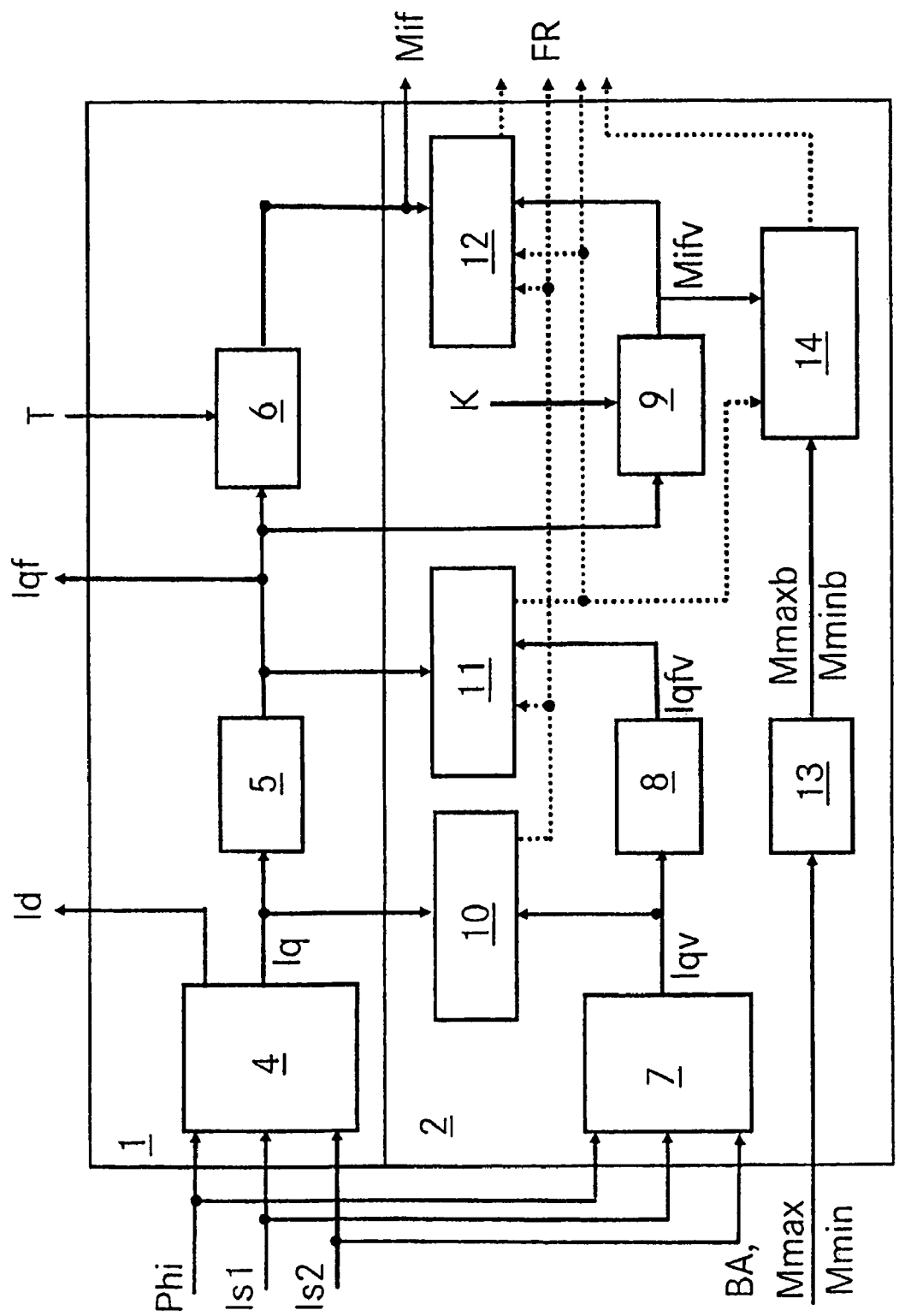
Figure 3:
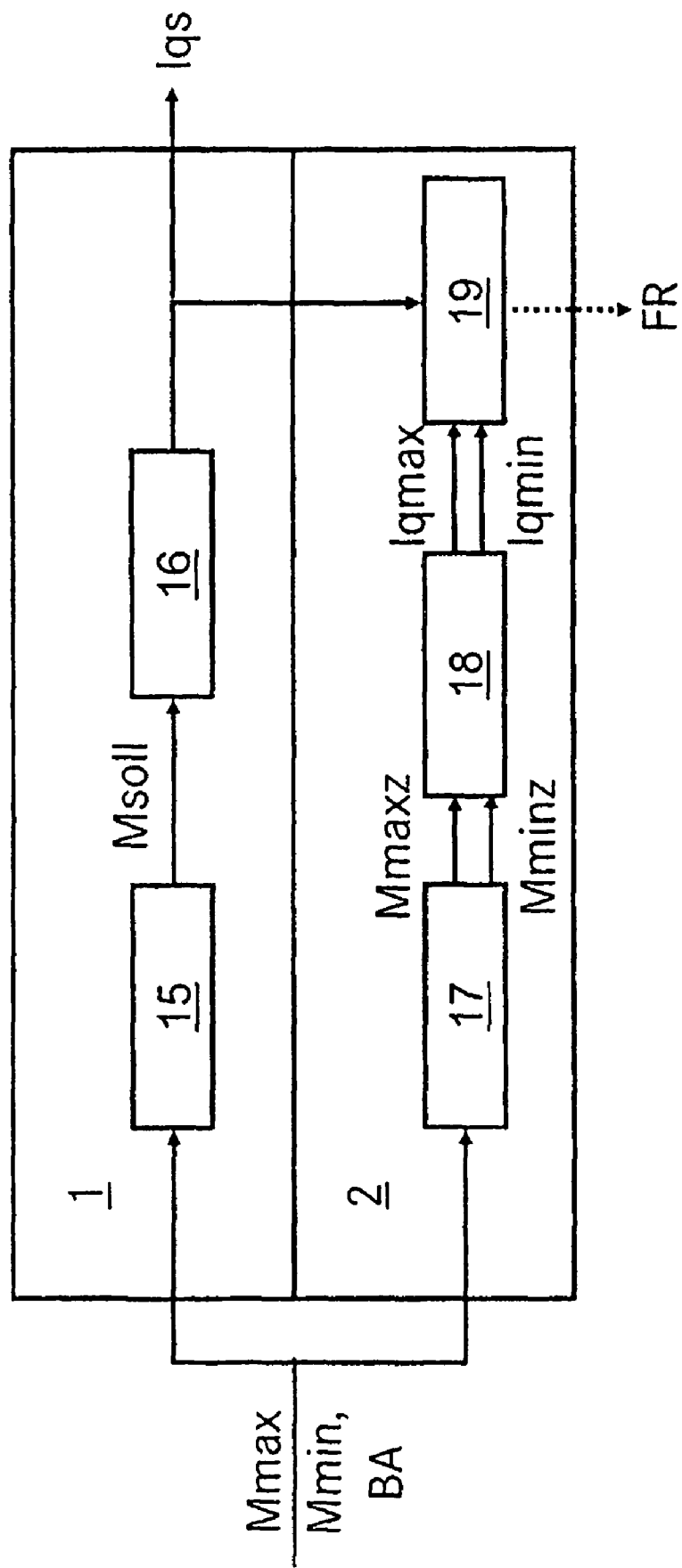

Further advantageous refinements of the invention will become evident from the drawings, in which:

FIG. 1 shows a schematic layout of a drive system according to the invention with an actual torque comparator which is also suitable for asynchronous machines, FIG. 2 shows a schematic layout of a specific embodiment of the drive system according to the invention with an actual torque comparator, and FIG. 3 shows a schematic layout of a drive system according to the invention, with a nominal current comparator.

DETAILED DESCRIPTION OF THE DRAWING FIGURES

Identical components or components having the same effect are provided with identical reference symbols in the various figures.

FIG. 1 shows a drive system for an electrical machine. A drive system for an electrical machine has the task of controlling the electrical machine and of ensuring fault-free operation of the electrical machine.

Electrical machines are used in a very wide range of applications. By way of example, electrical machines can be operated as starters/generators or as motors/generators in a motor vehicle. Electrical machines can likewise be used as the main propulsion system for a motor vehicle, as an additional propulsion system, or to assist the propulsion provided by an internal combustion engine provided in the motor vehicle, and/or to supply power to an on-board electrical power supply system that is provided in the motor vehicle.

The electrical machine may, for example, be in the form of a machine with permanent-magnet excitation, or an asynchronous machine.

The amplitude, frequency and phase of the winding-section currents in the electrical machine are set via an output stage which is associated with the electrical machine.

The drive system illustrated in FIG. 1 has a control unit 1 and a monitoring unit 2.

The control unit 1 contains the functions for driving and operating the electrical machine. It can be used to monitor components which are relevant for operation of the electrical machine, for diagnosis of input and output variables, and for control of fault reactions. The control unit 1 forms drive signals for the output stage of the electrical machine.

The monitoring unit 2 can be used to monitor the control unit 1 and the functional procedures in the control unit 1. In this case, the monitoring unit 1 identifies faults in the formation of the drive signals in the control unit 1.

Further details and embodiments of the control unit 1 and of the monitoring unit 2, as well as of the method for fault identification are can be found in German patent documents DE 102 004 002 767 and from DE 102 005 025 994, whose entire contents are herein expressly incorporated by reference.

In FIG. 1, the drive system receives information, via sensors which are not illustrated, regarding the actual phase angle Phi and the actual currents Is1 and Is2 in the electrical machine. This data is passed both to the control unit 1 and to the monitoring unit 2.

Coordinate transformer 4 of control unit 1 converts the actual phase angle Phi, the actual currents Is1 and Is2 of the electrical machine to an actual current component Id and to an actual current component Iq.

A filter 5 in the control unit 1 removes possible disturbances which are superimposed on the signal from the actual current component Iq. The filter 5 passes the filtered actual current component Iqf as a closed-loop control parameter to a closed-loop control device for closed-loop control of the current in the electrical machine. This closed-loop control device controls the output stage of the electrical machine.

The actual current component Id has possible disturbances which are superimposed on the signal removed from it in a filter 22 in the control unit 1. The filter 22 passes the filtered actual current component Idf as a closed-loop control parameter to a closed-loop control device for closed-loop control of the current in the electrical machine. This closed-loop control device controls the output stage of the electrical machine.

The operations which are carried out in the devices 4, 5 and 22 are carried out quickly in order to allow the system to have a fast reaction rate. Specifically, an operation is referred to as being fast when it takes approximately 100 μs to carry out (for example 125 μs).

The filter 5 passes the filtered actual current component Iqf to a torque calculation 6 in the control unit 1. The filter 22 passes the filtered actual current component Idf to a torque calculation 6 in the control unit 1.

A filtered actual torque Mif is determined in the torque calculation 6 from the filtered actual current components Idf and Iqf. In FIG. 1, this Mif is passed to a higher-level controller in the vehicle. The temperature of the electrical machine is included in the calculation for formation of Mif. In this case, the rotor resistance of an asynchronous machine is dependent on the temperature. In a machine with permanent-magnet excitation, the field strength is dependent on the temperature.

The operation carried out in the device 6 is carried out at an operation rate of about 10 ms, that is to say at a slower speed than that of the operations which are carried out in the device 4, 5 and 22. This is possible because the result is not required for closed-loop control of the electrical machine.

The monitoring unit 2 converts the actual phase angle Phi, the actual currents Is1 and Is2 of the electrical machine in a coordinate transformer 7. The coordinate transformer 7 emits an actual current component Iqv to a comparator 10, and emits an actual current component Idv to a comparator 20.

The comparator 10 is connected to the coordinate transformer 7 for the monitoring unit 2, and to the coordinate transformer 4 for the control unit 1. It compares the value of the actual current component Iq from the coordinate transformer 4 with the value of the actual current component Iqv from the coordinate transformer 7, and identifies a fault when the two values differ from one another by more than a defined tolerance. This makes it possible to detect faults in the control unit 1, from the coordinate transformation of Iq.

The comparator 20 is connected to the coordinate transformer 7 for the monitoring unit 2 and to the coordinate transformer 4 for the control unit 1. It compares the value of the actual current component Id from the coordinate transformer 4 with the value of the actual current component Idv from the coordinate transformer 7, and identifies a fault when the two values differ from one another by more than a defined tolerance. This makes it possible to detect faults in the control unit 1, from the coordinate transformation of Id.

If a fault is identified in comparator 10 or 20, then a signal for a fault reaction is passed to a data bus. By way of example, the actual value for the torque of the electrical machine can be set to an implausible value via the data bus. An output stage can likewise be switched off or shorted.

If a fault is found, the fault initiation of a downstream comparator 11 or 21 is blocked via a control line. In the embodiment illustrated in FIG. 1, this is done for all the low-level comparators, including the low-level comparators for the other current component.

Possible disturbances which are superimposed on the signal are removed from the actual current component Iqv in a filter 8 in the monitoring unit 2. The filter 8 passes the filtered actual current component Iqfv to a comparator 11 as a comparison value.

The comparator 11 is also connected to the filter 5 for the control unit 1. It compares the filtered value of the actual current component Iqf from the filter 5 with the filtered value of the actual current component Iqfv from the filter 8, and identifies a fault when the two values differ from one another by more than a defined tolerance. This allows faults in the control unit 1 to be identified in the filtering of Iq.

Possible disturbances which are superimposed on the signal are removed from the actual current component Idv in a filter 23 in the monitoring unit 2. The filter 23 passes the filtered actual current component Idfv to a comparator 21 as a comparison value.

The comparator 21 is also connected to the filter 22 for the control unit 1. It compares the filtered value of the actual current component Idf from the filter 22 with the filtered value of the actual current component Idfv from the filter 23, and identifies a fault when the two values differ from one another by more than a defined tolerance. This allows faults in the control unit 1 to be identified in the filtering of Id.

If a fault is identified in the comparator 11 or the comparator 21 then a signal for a fault reaction is passed to a data bus. In addition, the fault initiation of the downstream comparators 12 and 14 is blocked via a control line. It is also possible to provide for the fault initiation of further comparators to be blocked.

The filter 5 passes the filtered actual current component Iqf from the control unit 1 to a torque calculation 9 in the monitoring unit 2.

The filter 22 passes the filtered actual current component Idf from the control unit 1 to the torque calculation 9 in the monitoring unit 2.

A filtered actual torque Mifv is allocated from the filtered actual current components Iqf and Idf in the torque calculation 9. Calculated or stored theoretical values for the expected temperature of the electrical machine are included in the calculation for formation of Mifv.

The operation carried out in the device 9 is carried out with an operation rate of about 10 ms, that is to say operations are carried out at a slower rate in comparison to those carried out in the device 4, 5 and 22. This is possible because the result is not required for closed-loop control of the electrical machine.

The torque calculation 9 passes the filtered actual torque Mifv as a comparison value to a comparator 12. The comparator 12 is also connected to the torque calculation 6 in the control unit 1. It compares the value of the actual torque Mif, calculated using the measured temperature, in the torque calculation 6 with the value of the actual torque Mifv, determined on the basis of a theoretical temperature relationship, in the torque calculation 9, and identifies a fault when the two values differ from one another by more than a defined tolerance. This makes it possible to identify faults in the control unit 1 in the formation of the actual torque Mif. If a fault is identified, then a signal for a fault reaction is passed to a data bus. In this case, the output stage of the electrical machine can also be switched off or shorted.

The monitoring unit 2 also receives information from the data bus about a minimum nominal torque of the electrical machine Mmin, a maximum nominal torque of the electrical machine Mmax and about the operating mode BA (e.g., torque mode, rotation-speed mode, etc.) in which the electrical machine is being operated.

This information is processed in a device 13. The device 13 uses Mmin, Mmax and BA to form the permissible limit values Mminb and Mmaxb which are allocated in the present operating mode. The device 13 passes these values Mminb and Mmaxb to the comparator 14.

The comparator 14 is also connected to the torque calculation 9 in the monitoring unit 2. It compares the value of the actual torque, MifV, determined on the basis of a theoretical temperature relationship, of the torque calculation 9 with the permissible limit values Mminb and Mmaxb associated with the present operating mode.

The comparator 14 identifies a fault when the actual torque Mifv in the torque calculation 9 is outside the permissible tolerance limits Mminb and Mmaxb. If a fault is identified, then a signal for a fault reaction is passed to a data bus. In this case, the output stage of the electrical machine can also be switched off or shorted.

The operations which are carried out in the devices 7 to 14 in the monitoring unit 2 are carried out slowly (for example 1 to 10 ms) in comparison to the operations in the devices 4 and 5. This is necessary in order to reduce the computation time load caused by monitoring. The quickly determined variable Iqf can therefore be monitored with very tight tolerances. However, because of the discrepancy in the processing rates, only sample checking is possible. However, this results in only a minimal reduction in the quality of the monitoring.

The drive system illustrated in FIG. 2 represents a simplified embodiment of the apparatus according to the invention illustrated in FIG. 1. This is embodiment is suitable only for machines with permanent-magnet excitation. In the case of machines with permanent-magnet excitation, the actual current component Iq is proportional to the torque that is produced. Only the Iq component therefore need be considered. This simplifies the apparatus and reduces the number of devices required.

Only the differences from the embodiment illustrated in FIG. 1 will be explained in the following text. Devices and characteristics which are not described can be found from the description relating to FIG. 1.

The control unit 1 converts the actual phase angle Phi and the actual currents Is1 and Is2 of the electrical machine in a coordinate transformer 4 to an actual current component Id and an actual current component Iq.

The actual current component Id is emitted, and is used for closed-loop control of the electrical machine. In this case, the current component Id which is formed in the device 4 is not processed any further in the control unit 1. In FIG. 2, this avoids the device 22 provided in FIG. 1.

Possible disturbances which are superimposed on the signal are removed from the actual current component Iq in a filter 5 in the control unit 1. The filter 5 passes the filtered actual current component Iqf as a closed-loop control parameter to a closed-loop control device for closed-loop control of the current in the electrical machine. This closed-loop control device controls the output stage of the electrical machine.

A filtered actual torque Mif is associated with the filtered actual current component Iqf in the torque calculation 6. The temperature of the electrical machine is included in the calculation for formation of Mif. The temperature dependency of the field strength can be taken into account for the machine with permanent-magnet excitation to be considered here.

The monitoring unit 2 converts the actual phase angle Phi, the actual currents Is1 and Is2 in the electrical machine in a coordinate transformer 7, and emits an actual current component Iqv to a comparator 10.

The device 7 does not emit an actual current component Idv. Accordingly, the comparators 20 and 21 as well as the device 23 can be dispensed with.

The coordinate transformer 7 passes the actual current component Iqv to a filter 8, which removes possible disturbances which are superimposed on the signal from the actual current component Iqv, and thus produces a filtered actual current component Iqfv.

The filtered actual current component Iqfv produced in the filter 8 of the monitoring unit 2 is compared in the comparator 11 with the actual current component Iqf in the control unit 1 produced in the filter 5.

The filter 5 passes the filtered actual current component Iqf in the control unit 1 to a torque calculation 9 in the monitoring unit 2, as well. The filtered actual current component Iqf is associated with a filtered actual torque Mif in the torque calculation 9. Calculated or stored theoretical values of the expected temperature of the electrical machine are included in the calculation for formation of Mif.

In contrast to the embodiment illustrated in FIG. 1, Mif and Mifv are formed in the devices 6 and 9 in the embodiment illustrated in FIG. 2 without any knowledge of the actual current component Idf or Idfv. This embodiment, which is illustrated in FIG. 2 is, however, suitable only for machines with permanent-magnetic excitation without so-called buried magnets since this is the only situation in which the actual torque is proportional to Iq.

For other electrical machines (asynchronous machines and specific machines with permanent magnet excitation with so-called buried magnets), the embodiment illustrated in FIG. 1 must be used since the torque in this case depends on Id and on Iq. Id is therefore also processed, in addition to Iq in FIG. 1, with a comparison process being carried out, and these then being supplied to the actual torque comparator.

FIG. 3 shows one embodiment of the method according to the invention in which a nominal current is calculated, and the correctness of the calculation is monitored.

The drive system illustrated in FIG. 3 has a control unit 1 and a monitoring unit 2. The drive system receives information about a minimum nominal torque of the electrical machine Mmin, a maximum nominal torque of the electrical machine Mmax and about the operating mode BA (torque mode, rotation-speed mode, etc.) in which the electrical machine is being operated, via a data bus which is not illustrated. This data is passed both to the control unit 1 and to the monitoring unit 2.

The control unit 1 converts the operating parameters of the electrical machine Mmin, Mmax and BA in a device 15 to a nominal torque Mnom, and passes this value to a device 16.

The nominal torque Mnom is converted to a nominal current component Iqs in the device 16 in the control unit 1. In this case, the calculation may include limits such as the maximum permissible current in the electrical machine, temperature-dependent regulation or battery-dependent variables such as the maximum voltage and maximum current.

The nominal current component Iqs formed in the device 16 in the control unit 1 is emitted as a controlled variable. The operating parameters of the electrical machine Mmin, Mmax and BA are processed in a device 17 in the monitoring unit 2.

The device 17 in the monitoring unit 2 converts the input variables Mmin, Mmax and BA to a permissible lower limit value for the nominal torque Mminz and a permissible upper limit value for the nominal torque Mmaxz, and passes these values to a device 18.

Mminz and Mmaxz are converted in the device 18 in the monitoring unit 2 to minimum and maximum permissible limit values for a nominal current component Iqs. The limit values Iqmin and Iqmax which result from this are passed to a comparator 19 in the monitoring unit 2.

The comparator 19 is also connected to the device 16 in the control unit 1. It compares the value supplied from there for the nominal current component Iqs with the permissible Iqs limit values Iqmin and Iqmax determined by the device 18. This makes it possible to identify errors in the nominal value preset.

The comparator 19 identifies a fault when the nominal current component Iqs of the device 16 is outside the minimum and maximum permissible limit values for a nominal current component Iqmin and Iqmax. If a fault is identified, then a signal for a fault reaction is passed to a data bus. In this case, the output stage of the electrical machine can also be switched off or shorted.

The operations carried out in the devices 15 and 16 are carried out quickly (for example 125 µs) in order to allow the drive system to have a fast reaction rate. In contrast, the operations carried out in the devices 17 to 19 are carried out slowly (for example 1 to 10 ms) in order to keep the computation time load caused by the monitoring as low as possible.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A drive system for an electrical machine, comprising:
    a control unit including a device that converts one or more incoming operating parameters of the electrical machine to an output value;
    a monitoring unit, which is independent of the control unit, wherein the monitoring unit includes a device that converts the operating parameters to a comparison value, and the conversion is carried out more quickly in the control unit than in the monitoring unit; and
    a comparator, which compares the output value or an intermediate value of the output value with the comparison value.

2. The drive system as claimed in claim 1, wherein the monitoring unit has a comparator which compares a value, which is formed from a value of the control unit in a device, with a comparison value which is formed in a device of the monitoring unit.

3. The drive system as claimed in of claim 1, wherein the comparator identifies a fault when the output value which is supplied to the comparator, the intermediate value of the output value or a value formed in a device is outside a tolerance band of the comparison value supplied to the comparator.

4. The drive system as claimed in claim 1, wherein the comparator acts on an output stage of the electrical machine in the event of a fault.

5. The drive system as claimed in claim 1, wherein the comparator blocks a fault reaction of another comparator in the event of a fault.

6. The drive system as claimed in claim 1, wherein the output value is an actual current component for closed-loop control of an electrical machine.

7. The drive system as claimed in claim 1, wherein the output value is a nominal current component for closed-loop control of an electrical machine.

8. A method for operation of an electrical machine having a drive system, the method comprising the acts of:
    detecting, by a control unit and a monitoring unit, operating parameters of the electrical machine;
    converting, in the control unit, the detected operating parameters to an output value;
    converting, in the monitoring unit, the detected operating parameters to a comparison value, wherein the conversion is carried out more quickly in the control unit than in the monitoring unit; and
    comparing the output value or an intermediate value of the output value with the comparison value.

9. The method as claimed in claim 8, wherein a fault is identified when the output value or the intermediate value of the output value is outside a tolerance band of the comparison value.

10. The method as claimed in claim 8, wherein an output stage of the electrical machine is switched off or is shorted as a fault reaction when a fault occurs.

11. The method as claimed in claim 8, wherein an actual torque of the electrical machine is set to an implausible value as a fault reaction when a fault occurs.

12. The method as claimed in claim 10, wherein the fault reaction of another comparator is blocked in the event of a fault.

* * * * *